(12) United States Patent
Van der Heijden et al.

(10) Patent No.: US 12,057,662 B2
(45) Date of Patent: Aug. 6, 2024

(54) ELECTRIC VEHICLE SUPPLY EQUIPMENT CONNECTOR TO RESIST ELECTRICAL ARCING AND OTHER FAULTS

(71) Applicant: ABB E-mobility B.V., Delft (NL)

(72) Inventors: Jim Van der Heijden, Eindhoven (NL); Lars Peter Bech, Schiedam (NL); Gertjan Koolen, Eindhoven (NL)

(73) Assignee: ABB E-mobility B.V., Delft (NL)

( * ) Notice: Subject to any disclaimer, the term of this patent is extended or adjusted under 35 U.S.C. 154(b) by 386 days.

(21) Appl. No.: 17/412,290

(22) Filed: Aug. 26, 2021

(65) Prior Publication Data

US 2021/0391672 A1 Dec. 16, 2021

Related U.S. Application Data

(63) Continuation of application No. PCT/IB2019/051624, filed on Feb. 28, 2019.

(51) Int. Cl.
*H01R 13/648* (2006.01)
*B60L 53/16* (2019.01)
(Continued)

(52) U.S. Cl.
CPC .......... *H01R 13/6485* (2013.01); *B60L 53/16* (2019.02); *H01R 13/652* (2013.01); *H01R 13/04* (2013.01); *H01R 2201/26* (2013.01)

(58) Field of Classification Search
CPC .. H01R 13/6485; H01R 13/652; H01R 13/04; H01R 2201/26; H01R 13/68;
(Continued)

(56) References Cited

U.S. PATENT DOCUMENTS 4,794,331 A 12/1988 Schweitzer, Jr.
5,272,431 A 12/1993 Nee
(Continued)

FOREIGN PATENT DOCUMENTS

CN 102414816 A 4/2012
CN 202474315 U 10/2012
(Continued)

OTHER PUBLICATIONS

National Intellectual Property Administration, P. R. China,. Office Action in Chinese Patent Application No. 201980093196.4. 22 pp. (Dec. 21, 2023).

*Primary Examiner* — M Baye Diao
(74) *Attorney, Agent, or Firm* — Leydig, Voit & Mayer, Ltd.

(57) ABSTRACT

A connector for electric vehicle supply equipment includes: a housing; a first electrical coupling member supported by the housing and that mates with an inlet of an electric vehicle, the first electrical coupling member including a first pin part; a second electrical coupling member supported by the housing and that mates with the inlet, the second electrical coupling member including a second pin part; and a conductive barrier supported by the housing that extends between the first and second pin parts. The conductive barrier interacts with at least one of the first and second pin parts to provide a conduction path for electrical power monitorable to evaluate electrical isolation of the first and second electrical coupling members and avoid electrical arcing or short-circuiting.

20 Claims, 4 Drawing Sheets

(51) Int. Cl.
   *H01R 13/04* (2006.01)
   *H01R 13/652* (2006.01)
(58) Field of Classification Search
   CPC ... H01R 13/7135; B60L 53/16; B60L 3/0069;
   G01R 31/007; G01R 31/52; Y02T 10/70;
   Y02T 10/7072; Y02T 90/14
   USPC .......................................................... 320/109
   See application file for complete search history.

(56) References Cited

U.S. PATENT DOCUMENTS

| | | | | | |
|---|---|---|---|---|---|
| 6,139,351 | A | * | 10/2000 | Schaefer | B60L 3/0069 |
| | | | | | 439/372 |
| 8,379,375 | B2 | * | 2/2013 | Furuya | H01R 13/701 |
| | | | | | 361/833 |
| 8,597,043 | B2 | * | 12/2013 | Zhao | H01R 13/707 |
| | | | | | 439/352 |
| 8,610,554 | B2 | * | 12/2013 | Liu | B60L 3/0069 |
| | | | | | 320/109 |
| 9,283,852 | B2 | * | 3/2016 | Jefferies | B60L 53/31 |
| 9,425,541 | B2 | * | 8/2016 | Data | H01R 13/5208 |
| 2013/0271075 | A1 | * | 10/2013 | Restrepo | H02J 7/0042 |
| | | | | | 320/109 |
| 2013/0300429 | A1 | * | 11/2013 | Jefferies | B60L 53/31 |
| | | | | | 324/511 |
| 2016/0126679 | A1 | | 5/2016 | Kim et al. | |
| 2019/0131744 | A1 | * | 5/2019 | Blakborn | H01R 13/7031 |
| 2020/0227868 | A1 | * | 7/2020 | Kitamoto | H01R 13/6205 |

FOREIGN PATENT DOCUMENTS

| | | | | |
|---|---|---|---|---|
| CN | 104723886 A | | 6/2015 | |
| CN | 105324896 A | * | 2/2016 | .......... B60L 11/1816 |
| CN | 106660454 A | | 5/2017 | |
| CN | 107791851 A | | 3/2018 | |
| CN | 107985080 A | | 5/2018 | |
| CN | 109050343 A | * | 12/2018 | .......... H01R 25/142 |
| CN | 109643871 B | * | 2/2021 | .............. B60L 53/12 |
| DE | 10354286 A1 | * | 7/2004 | .............. H01R 11/12 |
| JP | 2015038446 A | | 2/2015 | |

\* cited by examiner

ELECTRIC VEHICLE SUPPLY EQUIPMENT CONNECTOR TO RESIST ELECTRICAL ARCING AND OTHER FAULTS

CROSS-REFERENCE TO PRIOR APPLICATION

This application is a continuation of International Patent Application No. PCT/IB2019/051624, filed on Feb. 28, 2019, the entire disclosure of which is hereby incorporated by reference herein.

FIELD

The present disclosure generally relates to supply equipment for electric vehicles, and more particularly, but not exclusively, to a connector for electric vehicle supply equipment.

BACKGROUND

Due to the power output levels associated with electric vehicle supply equipment (EVSE), various safety measures are employed to protect the equipment and the users thereof. Some existing devices, systems, and/or methods have various shortcomings in certain applications. Accordingly, there remains a need for further contributions in this area of technology to which the devices, apparatuses, methods, systems, and techniques disclosed herein are directed.

SUMMARY

In an embodiment the present invention provides a connector for electric vehicle supply equipment, the connector comprising: a housing; a first electrical coupling member supported by the housing and configured to mate with an inlet of an electric vehicle, the first electrical coupling member including a first pin part; a second electrical coupling member supported by the housing and configured to mate with the inlet, the second electrical coupling member including a second pin part; and a conductive barrier supported by the housing that extends between the first and second pin parts, the conductive barrier being configured to interact with at least one of the first and second pin parts to provide a conduction path for electrical power monitorable to evaluate electrical isolation of the first and second electrical coupling members and avoid electrical arcing or short-circuiting.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
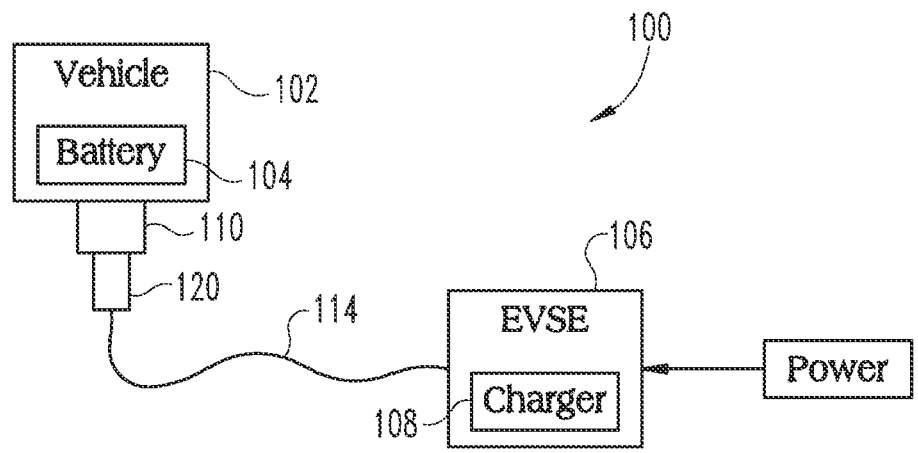
FIG. 1 is a schematic of an example electric vehicle charging system.

In an embodiment the present invention provides devices, apparatuses, methods, systems and techniques for protecting EVSE from electrical arcing and/or other faults within one or more components of the EVSE, such as in a connector that mates with the inlet of the electric vehicle, for example. Further embodiments, forms, objects, features, advantages, aspects, and benefits of the disclosure shall become apparent from the following description and drawings.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

The present disclosure relates to devices, apparatuses, methods, systems, and techniques for charging an electric vehicle with electrical power from a power grid or other source that is delivered by electric vehicle supply equipment through a connector. Referring now to FIG. 1, an illustrative electric vehicle charging system 100 is configured to charge an electric vehicle 102 that includes a rechargeable energy storage device 104, such as a battery or other suitable energy storage device, for example. In the illustrative embodiment, the electric vehicle 102 is embodied as, or otherwise includes, any vehicle powered partially or completely by electrical power, such as a vehicle driven by an electric motor, drive unit, or propulsion system, for example. In another example, the illustrative electric vehicle 102 may be embodied as, or otherwise include, a hybrid electric vehicle that includes a non-electrically powered drive unit (e.g., an internal combustion engine) in addition to one or more electrically-powered motors, drive units, or propulsion systems.

The illustrative system 100 includes electric vehicle supply equipment (EVSE) 106 that receives power from the power grid or other suitable power source. EVSE 106 includes a charger 108 that is configured to convert alternating current (AC) power to direct current (DC) power. It should be appreciated that the charger 108 may be remotely located from the vehicle 102 or provided on (e.g., mounted to) the vehicle 102. In any case, the vehicle 102 includes an inlet or socket 110 that is configured to mate with an illustrative connector 120 of the system 100 so that electrical power from the power source may be used to charge the battery 104 through the EVSE 106. Although the connector 120 is configured to be plugged into the inlet 110, it should be appreciated that the connector 120 may be mated with the inlet 110 in another suitable fashion. The connector 120 is illustratively coupled with the EVSE 106 by a cord 114 or other suitable connection arrangement.

Figures 3, 4:
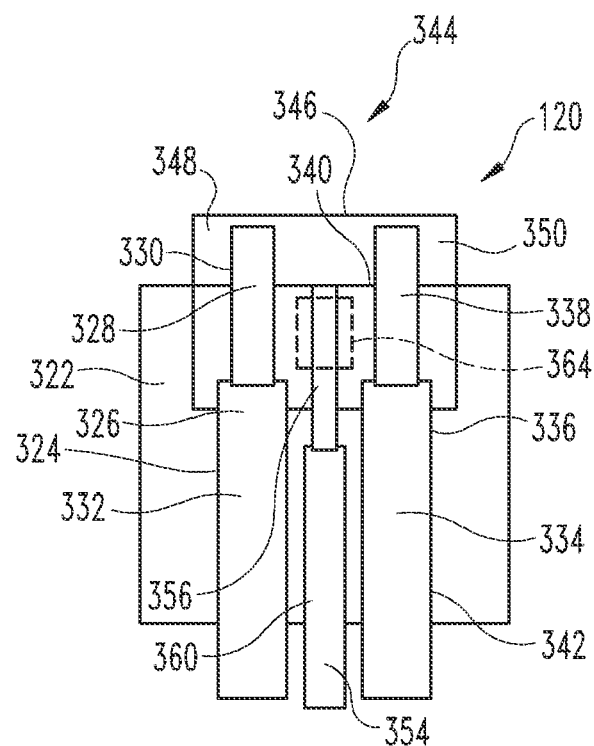
FIG. 3 is an elevation view of a connector of the electric vehicle charging system of FIG. 1 with certain features of the connector depicted diagrammatically.
FIG. 4 is a schematic of a connection configuration between the electric vehicle charging system of FIG. 1 and an isolation monitor.

As best seen in FIG. 3 and further discussed below, the illustrative connector 120 includes a housing 322 that supports an electrical coupling member 324, an electrical coupling member 334, and a conductive barrier 344. The electrical coupling members 324, 334 are configured to mate with (e.g., engageable with and disengageable from) the inlet 110 in use of the connector 120 (i.e., when the connector 120 is plugged into the inlet 110). The electrical coupling members 324, 334 include respective pin parts 328, 338, and the conductive barrier 344 extends between the pin parts 328, 338. In the illustrative embodiment, the conductive barrier 344 is configured for interaction with at least one of the pin parts 328, 338 to provide a conduction path for electrical power that may be monitored to evaluate electrical isolation of the electrical coupling members 324, 334 and avoid electrical arcing, short-circuiting, or other faults.

It should be appreciated from the description below that the aforementioned conduction path is embodied as, or otherwise includes, a leakage path LP (see FIG. 4) along which electrical power may be conducted between the pin parts 328, 338 to a ground (e.g., a protective earth ground). Therefore, electrical power conducted along the leakage path LP may be characterized as leakage current that unintentionally and/or undesirably flows between the pin parts 328, 338 to a ground, at least in some embodiments. Leakage current may result from the buildup of dust, moisture, contaminants, debris, or the like in connectors such as the illustrative connector 120. Because the conductive barrier 344 facilitates detection of leakage current, the illustrative connector 120 facilitates, or is otherwise associated with, improved resistance to certain electrical faults (arcing, short-circuiting, etc.) whose occurrence may be preceded by leakage current, at least in comparison to other configurations of connectors.

It should be appreciated that the illustrative EVSE 106 may be characterized or referred to as supply equipment, a vehicle charger, charging equipment, a charging station, a charger, or the like. Moreover, it should be appreciated that the EVSE 106 may be provided in any one of a number of configurations. For example, the EVSE 106 may be provided as a wall-mounted charger in a garage or building where vehicles are parked, on a pedestal or kiosk at an outdoor and/or curbside location, with one or more portable charging devices, or at other locations.

Figure 2:
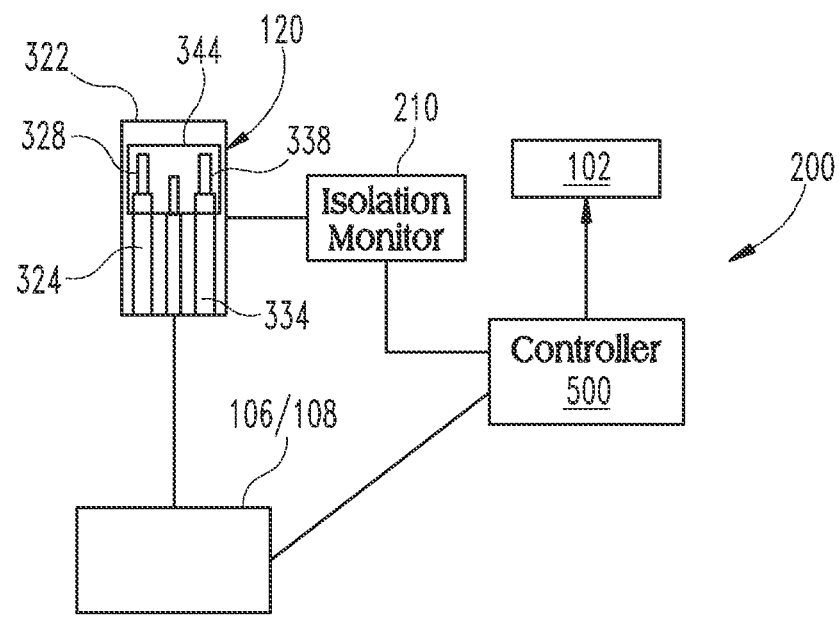
FIG. 2 is a schematic of an example controller arrangement for the electric vehicle charging system of FIG. 1.

Referring now to FIG. 2, an illustrative communication system 200 is associated with, and may be established during, operation of the electric vehicle charging system 100. In the communication system 200, a controller 500 (described in detail below with reference to FIG. 5) is communicatively coupled to multiple components of the system 100, such as the EVSE 106 and the vehicle 102, for example. Additionally, the controller 500 is communicatively coupled to an isolation monitor 210. Of course, it should be appreciated that in some embodiments, the controller 500 may be communicatively coupled to the connector 120.

It should be appreciated that the controller 500 may be incorporated into any one of the EVSE 106, the charger 108, the connector 120, the vehicle 102, and the isolation monitor 210. Furthermore, it should be appreciated that the controller 500 may be embodied as, or otherwise include, a collection of devices incorporated into the EVSE 106, the charger 108, the connector 120, the vehicle 102, and/or the isolation monitor 210. For ease of illustration, however, the controller 500 is depicted separately from the EVSE 106, the charger 108, the connector 120, the vehicle 102, and the isolation monitor 210 in FIG. 2.

The illustrative isolation monitor 210 is embodied as, or otherwise includes, any device or collection of devices capable of monitoring and/or detecting leakage current between the pin parts 328, 338 and a ground. To that end, the isolation monitor 210 is connected to the connector 120 as best seen in FIG. 4. As will be apparent from the discussion below, the isolation monitor 210 is configured to monitor leakage current both prior to and during the supply of electrical power to the vehicle 102 through the EVSE 106 in use of the electric vehicle charging system 100. In some embodiments, the isolation monitor 210 may be provided separately from the system 100 such that the isolation monitor 210 is coupled to and/or adapted for use with the system 100. In other embodiments, however, the isolation monitor 210 may be included in the system 100.

Referring now to FIG. 3, for ease of description, the housing 322 of the connector 120 is depicted transparently. The illustrative electrical coupling members 324, 334 of the connector 120 include respective electrodes 326, 336 which are embodied as, or otherwise include, DC electrodes. In the illustrative embodiment, the electrode 326 is embodied as a positive DC electrode and the electrode 336 is embodied as a negative DC electrode. Of course, it should be appreciated that in other embodiments, the electrode 326 may be embodied as a negative DC electrode and the electrode 336 may be embodied as a positive DC electrode.

Additionally, in other embodiments, it should be appreciated that the electrodes 326, 336 may each be embodied as another suitable electrode, such as an AC electrode included in an AC electrical coupling member, for example.

The electrodes 326, 336 are illustratively configured to mate with the inlet 110 in use of the connector 120 (i.e., when the connector 120 is plugged into the inlet 110). The electrodes 326, 336 are supported by the housing 322 and include the respective copper pin parts 328, 338 and respective insulated parts 332, 342. The copper pin parts 328, 338 project through respective openings 330, 340 formed in the housing 322 whereas the insulated parts 332, 342 are contained in, and may be embedded in, the housing 322.

In the illustrative embodiment, the conductive barrier 344 includes, or is otherwise embodied as, a metallic component 346 arranged between the copper pin parts 328, 338. In one example, the metallic component 346 may be embodied as, or otherwise include, a metallic plate 348 interposed between the pin parts 328, 338 that is configured to interface with and/or contact the pin parts 328, 338. In another example, the metallic component 346 may be embodied as, or otherwise include, a metallic shield 350 that at least partially covers the pin parts 328, 338 and is configured to interface with and/or contact the pin parts 328, 338. The metallic shield 350 at least partially surrounds the pin parts 328, 338 to minimize conduction of electrical power between the pin parts 328, 338 along a path other than the leakage path LP. Put another way, the metallic shield 350 covers the leakage path LP between the pins 328, 338 to minimize the possibility that current leakage along the path LP is not detected by the isolation monitor 210 when the isolation monitor 210 is connected to the connector 120.

The illustrative connector 120 includes a protective earth/functional ground (PE/GND) coupling member 354 supported by the housing 322 and arranged between the electrical coupling members 324, 334. The coupling member 354 has a PE/GND copper pin part 356 and a PE/GND insulated part 360. The PE/GND copper pin part 356 and the PE/GND insulated part 360 are contained in, and may be embedded in, the housing 322.

In the illustrative embodiment, the PE/GND coupling member 354 is coupled to and/or provides a low impedance path LI (see FIG. 4) along which electrical power may be conducted to a ground 410. The ground 410 is embodied as, or otherwise includes, a protective earth ground (e.g., a conductive element directly connected to the earth). Of course, it should be appreciated that in other embodiments, the ground 410 may be embodied as, or otherwise include, another suitable ground such as a signal ground or a chassis ground that may be coupled to a protective earth ground, for example. Additionally, it should be appreciated that in other embodiments, the member 354 may be coupled to and/or provide a low impedance path to another suitable point (which may not be a ground).

The illustrative conductive barrier 344 is configured for interaction with the PE/GND coupling member 354 to provide the path LI along which electrical power (e.g., electrical power conducted along the leakage path LP) may be conducted from the barrier 344 to the ground 410. In some embodiments, the conductive barrier 344 may interact with the PE/GND coupling member 354 such that the conductive barrier 344 at least partially extends around and/or covers the PE/GND copper pin part 356. Additionally, in some embodiments, the conductive barrier 344 may interact with the PE/GND coupling member 354 such that the conductive barrier 344 contacts and/or directly interfaces with the PE/GND copper pin part 356.

In some embodiments, the connector 120 may include a protective element 364 (shown in phantom in FIG. 3). In such embodiments, the protective element 364 may be arranged between the conductive barrier 344 and the PE/GND coupling member 354. In one example, the protective element 364 may be embodied as, or otherwise include, a fuse or another suitable overcurrent protection device. In another example, the protective element 364 may be embodied as, or otherwise include, a resistor or another suitable device for implementing electrical resistance.

Referring now to FIG. 4, the electrical coupling members 324, 334 of the connector 120 are coupled to respective terminals 424, 434 of a power source 420. As suggested above, the power source 420 may be the power grid or any other suitable power supply capable of providing electrical power that may be used to charge the battery 104 of the vehicle 102 through the EVSE 106 in use of the system 100. The isolation monitor 210 is coupled to the terminals 424, 434 to monitor current flow along the leakage path LP between the coupling members 324, 334.

In the illustrative embodiment, the terminal 424 is embodied as, or otherwise includes, a positive DC terminal and the terminal 434 is embodied as, or otherwise includes, a negative DC terminal. Of course, it should be appreciated that in other embodiments, the terminal 424 may be embodied as a negative DC terminal and the terminal 434 may be embodied as a positive DC terminal. Additionally, in other embodiments, it should be appreciated that the terminals 424, 434 may each be embodied as another suitable terminal, such as an AC terminal of a power source configured to supply AC power, for example.

In the illustrative embodiment, the isolation monitor 210 is coupled to a ground 440 and the power source 420 is coupled to a ground 450. The grounds 440, 450 may each be embodied as, or otherwise include, a protective earth ground (e.g., a conductive element directly connected to the earth). Of course, it should be appreciated that in other embodiments, the grounds 440, 450 may each be embodied as, or otherwise include, another suitable ground such as a signal ground or a chassis ground that may be coupled to a protective earth ground, for example. Additionally, it should be appreciated that in other embodiments, the isolation monitor 210 and the power source 420 may be coupled to and/or provide a low impedance path to another suitable point (which may not be a ground).

Figure 5:
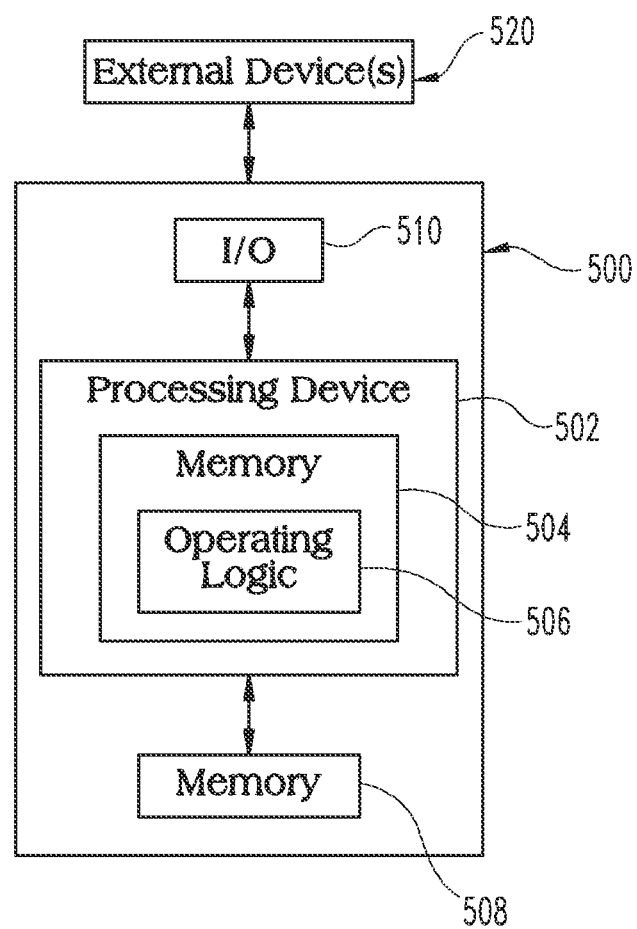
FIG. 5 is a schematic of an example controller apparatus for use with the electric vehicle charging system of FIG. 1.

Referring now to FIG. 5, the illustrative controller 500 may be embodied as, or otherwise include, a device or collection of devices configured to control a supply of electrical power to the vehicle 102 through the EVSE 106 and the connector 120 in use of the system 100. In the illustrative embodiment, the controller 500 includes a processing device or processor 502, memory 508 that is communicatively coupled to the processor 502, and an input/output device 510 that is communicatively coupled to the processor 502. Furthermore, in the illustrative embodiment, the controller 500 is communicatively coupled to one or more external devices 520. The one or more external devices 520 may be embodied as, or otherwise include, control devices included in the EVSE 106/charger 108, the vehicle 102, and/or the isolation monitor 210, for example.

The processor 502 may be embodied as, or otherwise include, any type of processor, controller, or other compute circuit capable of performing various tasks such as compute functions and/or controlling the functions of the system 100. For example, the processor 502 may be embodied as a single or multi-core processor(s), a microcontroller, or other processor or processing/controlling circuit. In some embodiments, the processor 502 may be embodied as, include, or be coupled to an FPGA, an application specific integrated circuit (ASIC), reconfigurable hardware or hardware circuitry, or other specialized hardware to facilitate performance of the functions described herein. Additionally, in some embodiments, the processor 502 may be embodied as, or otherwise include, a high-power processor, an accelerator co-processor, or a storage controller. In some embodiments still, the processor 502 may include more than one processor, controller, or compute circuit.

In the illustrative embodiment, the processor 502 may include memory 504. The memory 504 may be embodied as any type of volatile (e.g., dynamic random access memory (DRAM), etc.) or non-volatile memory capable of storing data (e.g., operating logic 506 defined by programming instructions such as software or firmware or by hardwired logic or other hardware) therein. Volatile memory may be embodied as a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

In some embodiments, the memory 504 may be embodied as a block addressable memory, such as those based on NAND or NOR technologies. The memory 504 may also include future generation nonvolatile devices, such as a three dimensional crosspoint memory device, or other byte addressable write-in-place nonvolatile memory devices. In some embodiments, the memory 504 may be embodied as, or may otherwise include, chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some embodiments, 3D crosspoint may comprise a transistor-less stackable cross point architecture in which memory cells sit at the intersection of word lines and bit lines and are individually addressable and in which bit storage is based on a change in bulk resistance.

Memory 508 may be substantially similar and/or identical to the memory 504. However, in some embodiments, the memory 504 may be internal to (e.g., incorporated into) the processor 502 whereas the memory 508 may be external to the processor 502. Of course, it should be appreciated that in some embodiments, one of the memory 504 and the memory 508 may be omitted from the controller 500.

The illustrative input/output device 510 is configured to enable the controller 500 to communicate with other local controllers (e.g., control devices included in the EVSE 106/charger 108, the vehicle 102, and/or the isolation monitor 210) or a central controller. The input/output device 510 may include a network adapter, network credential, interface, or a port (e.g., a USB port, serial port, parallel port, an analog port, a digital port, VGA, DVI, HDMI, FireWire, CAT 5, Ethernet, fiber, or any other type of port or interface), to name but a few examples. The input/output device 510 may include more than one of these adapters, credentials, or ports, such as a first port for receiving data and a second port for transmitting data, for example.

As described below with reference to FIG. 6, the memory 504 and/or the memory 508 may have instructions stored therein that are executable by the processor 502 to cause the processor 502 to evaluate electrical isolation of the electrodes 326, 336 of the connector 120 (i.e., based on the detection or lack of detection by the isolation monitor 210 of current conducted along the leakage path LP). Based on that evaluation, the instructions stored in the memory 504 and/or the memory 508 may be executable by the processor 502 to cause the processor 502 to interrupt or disable the supply of electrical power to the vehicle 102 from the EVSE 106 through the connector 120 to resist electrical arcing or short circuiting.

Figure 6:
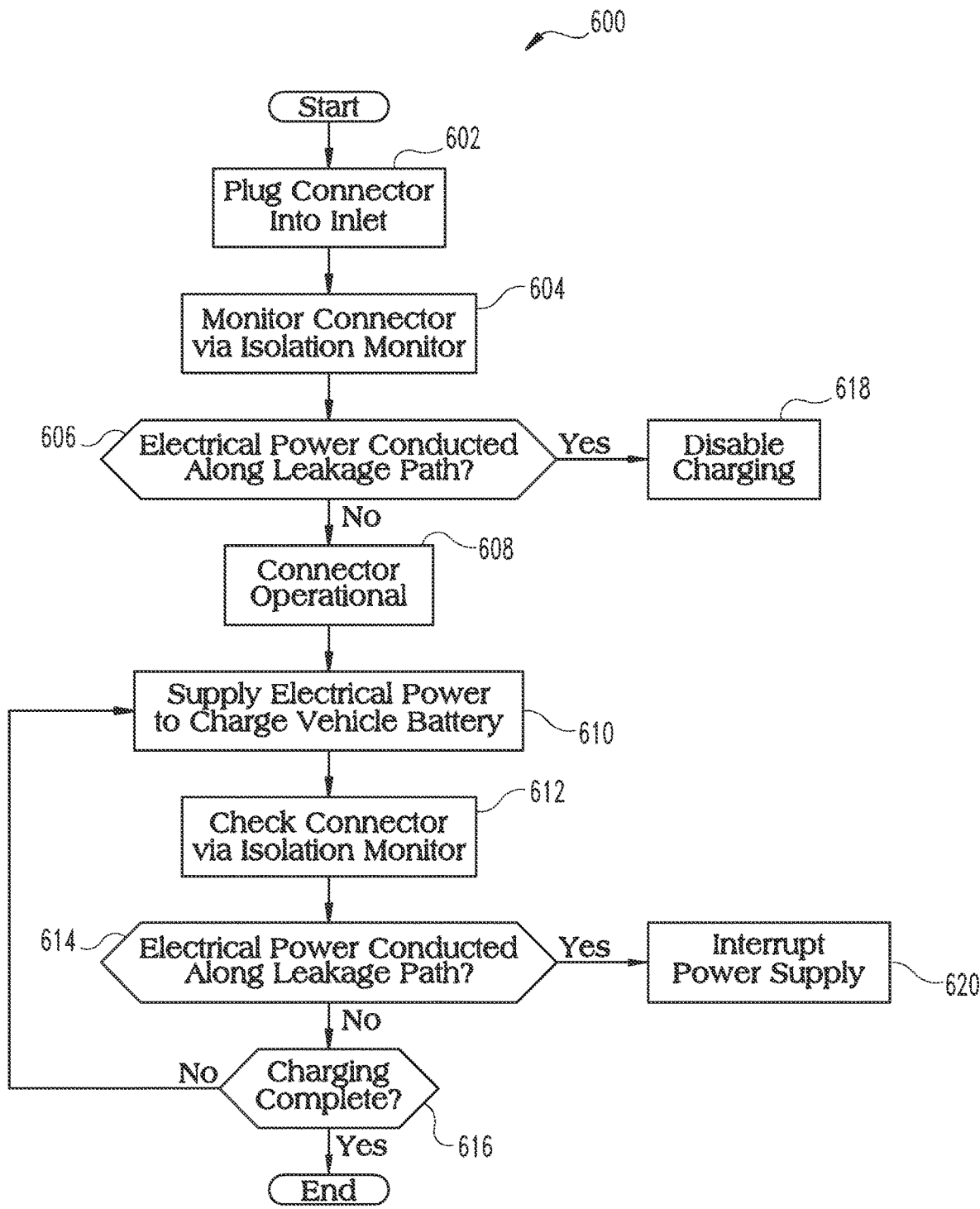
FIG. 6 is a flow diagram of an example procedure for supplying electrical power to an electric vehicle.

Referring now to FIG. 6, an illustrative method 600 of supplying electrical power to the vehicle 102 may be embodied as, or otherwise include, a set of instructions that are executable by the controller 500 (i.e., the processor 502 as indicated above). It should be appreciated, however, that in some embodiments, the illustrative method 600 may be cooperatively performed by the controller 500 and one or more other devices (e.g., control devices included in the EVSE 106/charger 108, the vehicle 102, and/or the isolation monitor 210). In such embodiments, performance of the illustrative method 600 may be associated with communication and/or coordination between the controller 500 and the one or more control devices. In any case, the method 600 corresponds to, or is otherwise associated with, performance of the blocks described below in the illustrative sequence of FIG. 6. It should be appreciated, however, that the method 600 may be performed in one or more sequences different from the illustrative sequence.

In addition, it should be appreciated that the blocks described below in the illustrative sequence of FIG. 6 may prompt, direct, or otherwise be associated with one or more actions performed by a user or operator in use of the system 100. For example, the blocks may correspond to, or otherwise be associated with, prompts that may be displayed (e.g., on a display, dashboard, or user interface) to prompt and/or direct user action in use of the system 100.

Accordingly, performance of the blocks of the illustrative method 600 may be associated with, or otherwise include, a control component (e.g., one or more actions performed/directed by the controller 500 and the one or more control devices) and/or an operator component (e.g., one or more actions performed by an operator in response to the control component).

The illustrative method 600 begins with block 602. In block 602 of the illustrative method 600, the controller 500 directs the connector 120 to be plugged into the inlet 110 of the vehicle 102. Of course, it should be appreciated that operator action may be associated with the performance of block 602. From block 602, the method 600 subsequently proceeds to block 604.

In block 604 of the illustrative method 600, the controller 500 monitors the connector 120 via the isolation monitor 210. More specifically, in block 604, the controller 500 monitors the connector 120 via the isolation monitor 210 to evaluate the electrical isolation of the electrical coupling members 324, 334. In doing so, the controller 500 monitors the connector 120 to determine if electrical power is conducted along the leakage path LP between the coupling members 324, 334. From block 604, the method 600 subsequently proceeds to block 606.

In block 606 of the illustrative method 600, the controller 500 determines, based on input provided thereto by the isolation monitor 210, whether electrical power is conducted along the leakage path LP between the coupling members 324, 334 of the connector 120. If the controller 500 determines in block 606 that electrical power is not conducted along the leakage path LP, the method 600 subsequently proceeds to block 608.

In block 608 of the illustrative method 600, the controller 500 makes a determination that the connector 120 is operational. That determination may include, or otherwise be associated with, a determination that the connector 120 may be used in combination with the EVSE 106 to charge the battery 104 of the vehicle 102 without a substantial or appreciable safety risk to the operator. As such, that determination may include, or otherwise be associated with, a determination that the connector 120 may be used without a substantial or appreciable risk of an electrical fault such as arcing or short-circuiting, for example. In any case, from block 608, the method 600 subsequently proceeds to block 610.

In block 610 of the illustrative method 600, the controller 500 supplies (or directs/enables the supply of) electrical power to the battery 104 through the connector 120 and the EVSE 106 to charge the battery 104. In some embodiments, block 610 may include, or otherwise be associated with, enablement and/or activation of the charger 108. Regardless, from block 610, the method 600 subsequently proceeds to block 612.

In block 612 of the illustrative method 600, similar to block 604, the controller 500 checks the connector 120 to determine if electrical power is conducted along the leakage path LP between the electrical coupling members 324, 334. In doing so, the controller 500 receives input from the isolation monitor 210 indicative of the detection or lack of detection of electrical power conducted along the leakage path LP. From block 612, the method 600 subsequently proceeds to block 614.

In block 614 of the illustrative method 600, similar to block 606, the controller 500 determines, based on input provided thereto by the isolation monitor 210, whether electrical power is conducted along the leakage path LP between the coupling members 324, 334 of the connector 120. If the controller 500 determines in block 614 that electrical power is not conducted along the leakage path LP, the method 600 subsequently proceeds to block 616.

In block 616 of the illustrative method 600, the controller 500 determines whether charging of the battery 104 of the vehicle 102 is complete. In doing so, the controller 500 may receive input indicative of the charge state of the battery 104 that is provided thereto by the vehicle 102. The determination by the controller 500 in block 616 that charging of the battery 104 is complete may correspond to, or otherwise be associated with, one iteration of the method 600.

Returning to block 606 of the illustrative method 600, if the controller 500 determines in block 606 that electrical power is conducted along the leakage path LP, the method 600 subsequently proceeds to block 618. In block 618, the controller 500 disables and/or deactivates the charger 108 to prevent electrical power from being supplied to the vehicle 102 through the connector 120 and the EVSE 106 and avoid an electrical fault (e.g., arcing, short-circuiting). In doing so, the controller 500 may place the charger 108 in a safe mode or operating state.

Returning to block 614 of the illustrative method 600, if the controller 500 determines in block 614 that electrical power is conducted along the leakage path LP, the method 600 subsequently proceeds to block 620. In block 620, the controller 500 interrupts the power supply to the battery 104 through the connector 120 and the EVSE 106. In doing so, the controller 500 may disable or deactivate the charger 108 to place the charger 108 in a safe operating state in similar fashion to block 618.

Returning to block 616 of the illustrative method 600, if the controller 500 determines in block 616 that the charging of the battery 104 of the vehicle 102 is not complete, the method 600 subsequently returns to block 610.

It is contemplated that the various aspects, features, processes, and operations from the various embodiments may be used in any of the other embodiments unless expressly stated to the contrary. Certain operations illustrated in the Figures may be implemented by a computer executing a computer program product on a non-transient, computer-readable storage medium, where the computer program product includes instructions causing the computer to execute one or more of the operations, or to issue commands to other devices to execute one or more operations.

Various aspects of the present disclosure are contemplated. According to one aspect, a connector for electric vehicle supply equipment is provided. The connector includes a housing, a first electrical coupling member supported by the housing and configured to mate with an inlet of an electric vehicle, and a second electrical coupling member supported by the housing and configured to mate with the inlet. The first electrical coupling member includes a first pin part and the second electrical coupling member includes a second pin part. A conductive barrier supported by the housing extends between the first and second pin parts. The conductive barrier is configured for interaction with at least one of the first and second pin parts to provide a conduction path for electrical power that may be monitored to evaluate electrical isolation of the first and second electrical coupling members and avoid electrical arcing or short-circuiting.

In one embodiment, the first electrical coupling member includes a DC electrode and the second electrical coupling member includes a DC electrode. In another embodiment, a PE/GND coupling member is supported by the housing and arranged between the first and second electrical coupling members. In a refinement of this embodiment, the conductive barrier is configured for interaction with the PE/GND coupling member to provide a low impedance path along which electrical power may be conducted from the conductive barrier to a ground. In a further refinement, a protective element is arranged between the conductive barrier and the PE/GND coupling member. In yet a further refinement, the protective element is a fuse or a resistor.

In another embodiment, the conductive barrier includes a metallic component arranged between the first and second pin parts. In one refinement, the metallic component at least partially covers the first and second pin parts. In a further refinement, the metallic component at least partially surrounds the first and second pin parts to minimize conduction of electrical power between the first and second pin parts along a path other than the conduction path.

According to another aspect, a system includes electric vehicle supply equipment for providing electrical power to an electric vehicle and a connector coupled to the electric vehicle supply equipment. The connector includes a housing, a first electrode supported by the housing and configured to mate with an inlet of the electric vehicle, and a second electrode supported by the housing and configured to mate with the inlet. The first electrode includes a first pin part and the second electrode includes a second pin part. A conductive barrier supported by the housing extends between the first and second pin parts. The conductive barrier configured for interaction with at least one of the first and second pin parts to provide a conduction path for electrical power that may be monitored to evaluate electrical isolation of the first and second electrodes and avoid electrical arcing or short-circuiting.

In one embodiment, one of the first and second electrodes is a positive DC electrode and the other of the first and second electrodes is a negative DC electrode. In another embodiment, the connector includes a PE/GND coupling member supported by the housing that is arranged between the first and second electrical coupling members and configured for interaction with the conductive barrier to provide a low impedance path along which electrical power may be conducted from the conductive barrier to a ground. In a further embodiment, the conductive barrier is a metallic plate interposed between the first and second pin parts. In yet another embodiment, the conductive barrier is a metallic shield that at least partially surrounds the first and second pin parts to minimize conduction of electrical power between the first and second pin parts along a path other than the conduction path.

In another embodiment, the system includes a controller configured to control a supply of electrical power to the electric vehicle from the electric vehicle supply equipment. The controller has a memory and a processor coupled to the memory. The memory has instructions stored therein that are executable by the processor to cause the processor to evaluate the electrical isolation of the first and second electrodes and interrupt or disable the supply of electrical power to the electric vehicle from the electrical vehicle supply equipment through the connector based on the evaluation. In a refinement of this embodiment, the instructions stored in the memory are executable by the processor to cause the processor to interrupt or disable the supply of electrical power to the electric vehicle from the electrical vehicle supply equipment through the connector based on the evaluation to resist electrical arcing or short circuiting.

According to another aspect, a method for supplying electrical power to an electric vehicle includes: plugging a connector of electric vehicle supply equipment that has a first electrical coupling member, a second electrical coupling member, and a conductive barrier extending between first and second pin parts of the respective first and second electrical coupling members into an inlet of the electric vehicle; monitoring the connector to determine if electrical power is conducted along a conduction path provided by at least one of the first and second pin parts and the conductive barrier; and supplying electrical power from the electric vehicle supply equipment to the electric vehicle through the connector in response to a determination that electrical power is not conducted along the conduction path.

In one embodiment, monitoring the connector to determine if electrical power is conducted along the conduction path is performed before supplying electrical power from the electric vehicle supply equipment to the electric vehicle through the connector. In one refinement, the method includes checking the connector to determine if electrical power is conducted along the conduction path after supplying electrical power from the electric vehicle supply equipment to the electric vehicle through the connector. In yet a further refinement, the method includes interrupting the supply of electrical power from the electric vehicle supply equipment to the electric vehicle through the connector in response to a determination that electrical power is conducted along the conduction path to avoid electrical arcing or short-circuiting.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A connector for electric vehicle supply equipment, the connector comprising:
   a housing;
   a first electrical coupling member supported by the housing and configured to mate with an inlet of an electric vehicle, the first electrical coupling member including a first pin part;
   a second electrical coupling member supported by the housing and configured to mate with the inlet, the second electrical coupling member including a second pin part; and
   a conductive barrier supported by the housing that extends between the first and second pin parts, the conductive barrier being configured to interact with at least one of the first and second pin parts to provide a conduction path for electrical power monitorable to evaluate electrical isolation of the first and second electrical coupling members and avoid electrical arcing or short-circuiting.

2. The connector of claim 1, wherein the first electrical coupling member includes a direct current (DC) electrode and the second electrical coupling member includes a DC electrode.

3. The connector of claim 1, further comprising:
   a protective earth/functional ground (PE/GND) coupling member supported by the housing and arranged between the first and second electrical coupling members.

4. The connector of claim 3, wherein the conductive barrier is configured for interaction with the PE/GND coupling member to provide a low impedance path along which electrical power is provided a path from the conductive barrier to a ground.

5. The connector of claim 4, further comprising:
   a protective element arranged between the conductive barrier and the PE/GND coupling member.

6. The connector of claim 5, wherein the protective element comprises a fuse or a resistor.

7. The connector of claim 1, wherein the conductive barrier includes a metallic component arranged between the first and second pin parts.

8. The connector of claim 7, wherein the metallic component at least partially covers the first and second pin parts.

9. The connector of claim 8, wherein the metallic component at least partially surrounds the first and second pin parts to minimize conduction of electrical power between the first and second pin parts along a path other than a conduction path.

10. A system, comprising:
electric vehicle supply equipment configured to provide electrical power to an electric vehicle;
a connector coupled to the electric vehicle supply equipment, the connector including a housing;
a first electrode supported by the housing and configured to mate with an inlet of the electric vehicle, the first electrode including a first pin part;
a second electrode supported by the housing and configured to mate with the inlet, the second electrode including a second pin part; and
a conductive barrier supported by the housing that extends between the first and second pin parts, the conductive barrier being configured to interact with at least one of the first and second pin parts to provide a conduction path for electrical power that is monitorable to evaluate electrical isolation of the first and second electrodes and avoid electrical arcing or short-circuiting.

11. The system of claim 10, wherein one of the first and second electrodes comprises a positive direct current (DC) electrode and an other of the first and second electrodes comprises a negative DC electrode.

12. The system of claim 10, wherein the connector includes a protective earth/functional ground (PE/GND) coupling member supported by the housing that is arranged between the first and second electrical coupling members and configured to interact with the conductive barrier to provide a low impedance path along which electrical power is provided a path from the conductive barrier to a ground.

13. The system of claim 10, wherein the conductive barrier comprises a metallic plate interposed between the first and second pin parts.

14. The system of claim 10, wherein the conductive barrier comprises a metallic shield that at least partially surrounds the first and second pin parts to minimize conduction of electrical power between the first and second pin parts along a path other than the conduction path.

15. The system of claim 10, further comprising:
a controller configured to control a supply of electrical power to the electric vehicle from the electric vehicle supply equipment, the controller having a memory and a processor coupled to the memory, the memory having instructions stored therein that are executable by the processor to cause the processor to evaluate the electrical isolation of the first and second electrodes as an evaluation and interrupt or disable the supply of electrical power to the electric vehicle from the electrical vehicle supply equipment through the connector based on the evaluation.

16. The system of claim 15, wherein the instructions stored in the memory are executable by the processor to cause the processor to interrupt or disable the supply of electrical power to the electric vehicle from the electrical vehicle supply equipment through the connector based on the evaluation to resist electrical arcing or short circuiting.

17. A method for supplying electrical power to an electric vehicle, the method comprising:
plugging a connector of electric vehicle supply equipment that has a first electrical coupling member, a second electrical coupling member, and a conductive barrier extending between first and second pin parts of the respective first and second electrical coupling members into an inlet of the electric vehicle;
monitoring the connector to determine if electrical power is conducted along a conduction path provided by at least one of the first and second pin parts and the conductive barrier; and
supplying electrical power from the electric vehicle supply equipment to the electric vehicle through the connector in response to a determination that electrical power is not conducted along the conduction path.

18. The method of claim 17, wherein monitoring the connector to determine if electrical power is conducted along the conduction path is performed before supplying electrical power from the electric vehicle supply equipment to the electric vehicle through the connector.

19. The method of claim 18, further comprising:
checking the connector to determine if electrical power is conducted along the conduction path after supplying electrical power from the electric vehicle supply equipment to the electric vehicle through the connector.

20. The method of claim 19, further comprising:
interrupting the supplying electrical power from the electric vehicle supply equipment to the electric vehicle through the connector in response to a determination that electrical power is conducted along the conduction path to avoid electrical arcing or short-circuiting.

* * * * *